US012593502B2

(12) United States Patent
Wong et al.

(10) Patent No.: US 12,593,502 B2
(45) Date of Patent: Mar. 31, 2026

(54) INTERCONNECTED ARRAY TRANSISTORS INCLUDING SOURCE AND DRAIN BUS BARS AND FINGERS

(71) Applicant: Sumitomo Electric Device Innovations, Inc., Yokohama (JP)

(72) Inventors: James Wong, Yokohama (JP); Kento Kawasaki, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 486 days.

(21) Appl. No.: 18/112,786

(22) Filed: Feb. 22, 2023

(65) Prior Publication Data

US 2023/0268343 A1 Aug. 24, 2023

(30) Foreign Application Priority Data

Feb. 24, 2022 (JP) ................................. 2022-026396

(51) Int. Cl.
*H10D 84/82* (2025.01)
*H01L 23/00* (2006.01)
(Continued)

(52) U.S. Cl.
CPC ........... *H10D 84/83* (2025.01); *H01L 23/481* (2013.01); *H01L 23/49844* (2013.01)

(58) Field of Classification Search
CPC .. H10D 84/83; H10D 64/254; H10D 62/8503; H10D 64/257; H10D 89/105;
(Continued)

(56) References Cited

U.S. PATENT DOCUMENTS 5,883,407 A 3/1999 Kunii et al.
2002/0140024 A1 10/2002 Aoki et al.
(Continued)

FOREIGN PATENT DOCUMENTS

JP 08-148570 A 6/1996
JP 11-307577 A 11/1999
(Continued)

OTHER PUBLICATIONS

Extended European Search Report issued on Aug. 8, 2023 for European Patent Application No. 23157952.5.
Japanese Office Action issued on Jul. 15, 2025 for Japanese Patent Application No. 2022-026396.

*Primary Examiner* — Herve-Louis Y Assouman
(74) *Attorney, Agent, or Firm* — Volpe Koenig

(57) ABSTRACT

A semiconductor device includes a source bus bar provided on a first surface of a substrate and overlapping with a first via hole penetrating through the substrate, a plurality of first transistors arranged in a second direction intersecting a first direction, each of the first transistors including a first source finger, a first drain finger and a first gate finger which extend in the first direction on the first surface, the first source finger being electrically connected to the source bus bar, and a plurality of second transistors arranged in the second direction, each of the second transistors including a second source finger, a second drain finger and a second gate finger which extend in the first direction on the first surface, the second source finger being electrically connected to the source bus bar, the first transistors and the second transistors sandwiching the source bus bar.

19 Claims, 10 Drawing Sheets

(51) Int. Cl.

| | |
|---|---|
| *H01L 23/48* | (2006.01) |
| *H01L 23/482* | (2006.01) |
| *H01L 23/498* | (2006.01) |
| *H01L 23/66* | (2006.01) |
| *H01L 25/065* | (2023.01) |
| *H10D 62/85* | (2025.01) |
| *H10D 64/23* | (2025.01) |
| *H10D 84/83* | (2025.01) |
| *H10D 89/10* | (2025.01) |

(58) Field of Classification Search
CPC ...... H10D 84/82; H10D 89/10; H01L 23/481;
H01L 23/49844; H01L 24/49; H01L
2223/6655; H01L 23/66; H01L 25/0655;
H01L 23/4824
See application file for complete search history.

(56) References Cited

U.S. PATENT DOCUMENTS

| | | | |
|---|---|---|---|
| 2004/0048463 | A1 | 3/2004 | Haematsu |
| 2005/0133829 | A1 | 6/2005 | Kunii et al. |
| 2011/0084341 | A1 | 4/2011 | Kosaka |
| 2016/0079403 | A1* | 3/2016 | Yamamura ........... H10D 30/475 |
| | | | 257/194 |
| 2019/0081141 | A1* | 3/2019 | Mizan .................. H10D 62/127 |
| 2019/0109570 | A1 | 4/2019 | Vedula et al. |
| 2022/0148941 | A1 | 5/2022 | Yoshitsugu et al. |

FOREIGN PATENT DOCUMENTS

| | | |
|---|---|---|
| JP | 2002-299351 A | 10/2002 |
| JP | 2009-289935 A | 12/2009 |
| WO | 2020/255259 A | 12/2020 |

* cited by examiner

INTERCONNECTED ARRAY TRANSISTORS INCLUDING SOURCE AND DRAIN BUS BARS AND FINGERS

CROSS REFERENCE TO RELATED APPLICATIONS

This application claims priority based on Japanese Patent Application No. 2022-026396 filed on Feb. 24, 2022, and the entire contents of the Japanese patent applications are incorporated herein by reference.

FIELD

The present disclosure relates to a semiconductor device.

BACKGROUND

In a field effect transistor (FET) having a source, gate and drain, it is known to arrange a plurality of unit FETs each having a source finger, a gate finger and a drain finger in an extending direction of the fingers (for example, Patent Document 1: Japanese Patent Application Laid-Open No. 2002-299351).

SUMMARY

A semiconductor device according to the present disclosure includes: a source bus bar provided on a first surface of a substrate and overlapping with a first via hole penetrating through the substrate as viewed from a thickness direction of the substrate; a plurality of first transistors arranged in a second direction intersecting a first direction, each of the first transistors including a first source finger, a first drain finger and a first gate finger which extend in the first direction and are provided on the first surface, the first source finger being electrically connected to the source bus bar; and a plurality of second transistors arranged in the second direction, each of the second transistors including a second source finger, a second drain finger and a second gate finger which extend in the first direction and are provided on the first surface, the second source finger being electrically connected to the source bus bar, the first transistors and the second transistors sandwiching the source bus bar.

DETAILED DESCRIPTION OF EMBODIMENTS

Figure 1:
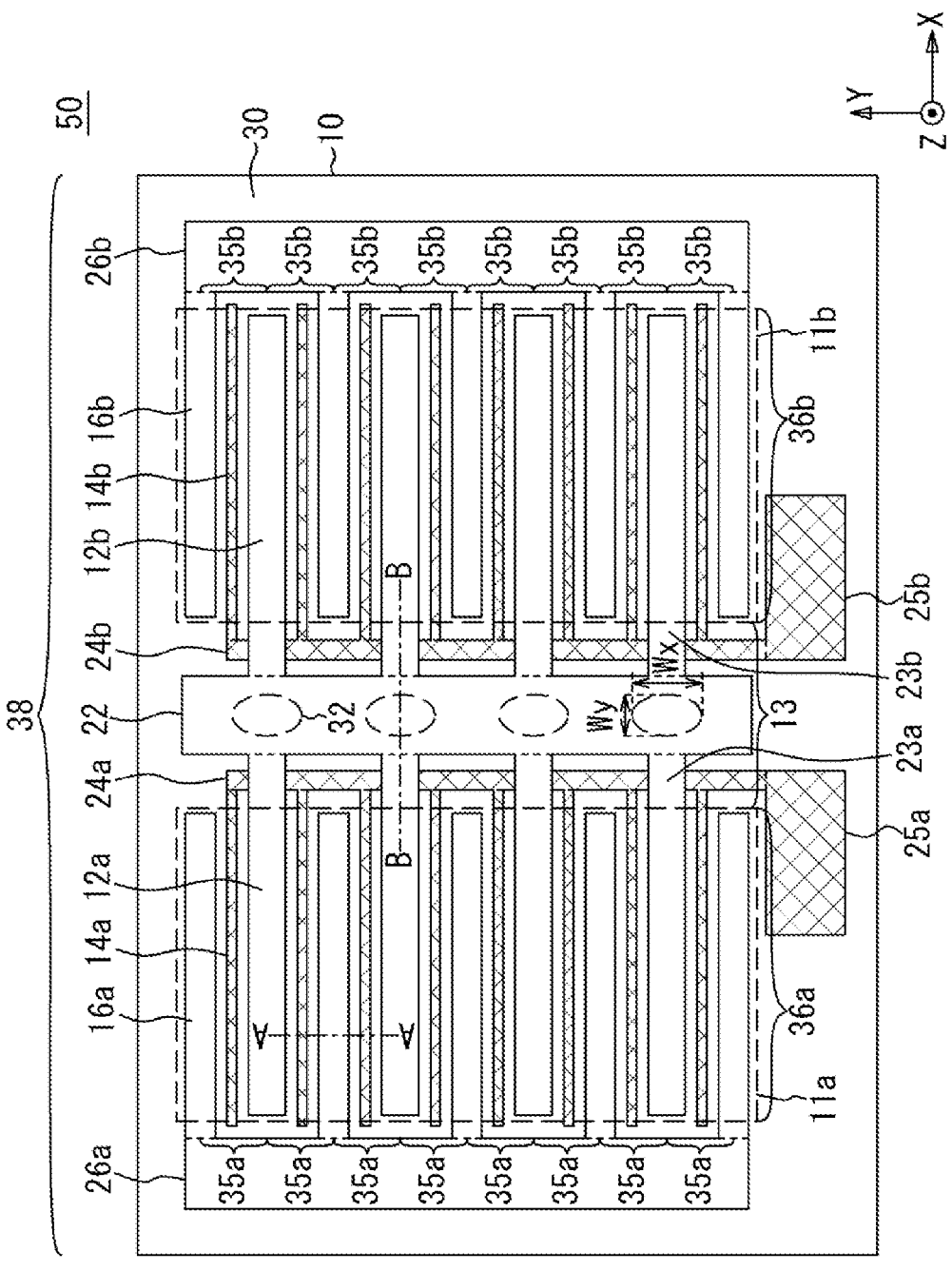
FIG. 1 is a plan view of a semiconductor device according to a first embodiment.

In Patent Document 1, heat interference may occur between a plurality of unit FET groups provided in the extending direction of the fingers.

The present disclosure has been made in view of the above problems, and an object of the present disclosure is to suppress the heat interference.

Details of Embodiments of the Present Disclosure

First, the contents of the embodiments of this disclosure are listed and explained.

(1) A semiconductor device according to the present disclosure includes: a source bus bar provided on a first surface of a substrate and overlapping with a first via hole penetrating through the substrate as viewed from a thickness direction of the substrate; a plurality of first transistors arranged in a second direction intersecting a first direction, each of the first transistors including a first source finger, a first drain finger and a first gate finger which extend in the first direction and are provided on the first surface, the first source finger being electrically connected to the source bus bar; and a plurality of second transistors arranged in the second direction, each of the second transistors including a second source finger, a second drain finger and a second gate finger which extend in the first direction and are provided on the first surface, the second source finger being electrically connected to the source bus bar, the first transistors and the second transistors sandwiching the source bus bar. Thermal interference between the first transistor and the second transistor can be suppressed by the first via hole.

(2) At least a part of the first via hole may be a cavity.

(3) The semiconductor device further may include a first metal layer filled in the first via hole and having a thermal conductivity lower than a thermal conductivity of the substrate.

(4) The source bus bar may overlap with a plurality of first via holes, and the plurality of first via holes may be arranged in the second direction.

(5) A width of the first via hole in the second direction may be larger than a width of the first via hole in the first direction.

(6) The semiconductor device further may include: a first gate bus bar provided on the first surface between the plurality of first transistors and the source bus bar and electrically connected to the first gate finger; and a second gate bus bar provided on the first surface between the plurality of second transistors and the source bus bar and electrically connected to the second gate finger.

(7) The semiconductor device further may include: a first source wiring electrically connecting the first source finger and the source bus bar and intersecting the first gate bus bar in a non-contact manner; and a second source wiring electrically connecting the second source finger and the source bus bar and intersecting the second gate bus bar in the non-contact manner.

(8) The semiconductor device further may include: a first drain bus bar provided on the first surface, sandwiching the plurality of first transistors together with the source bus bar, and connected to the first drain finger; and a second drain bus bar provided on the first surface, sandwiching the plurality of second transistors together with the source bus bar, and connected to the second drain finger.

(9) The first source finger may overlap with a second via hole penetrating through the substrate as viewed from the thickness direction of the substrate, and the second source finger may overlap with a third via hole penetrating through the substrate as viewed from the thickness direction of the substrate.

(10) The semiconductor device further may include a second metal layer provided on a second surface opposite to the first surface of the substrate and electrically connected to the source bus bar via the first via hole.

Specific examples of a semiconductor device in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
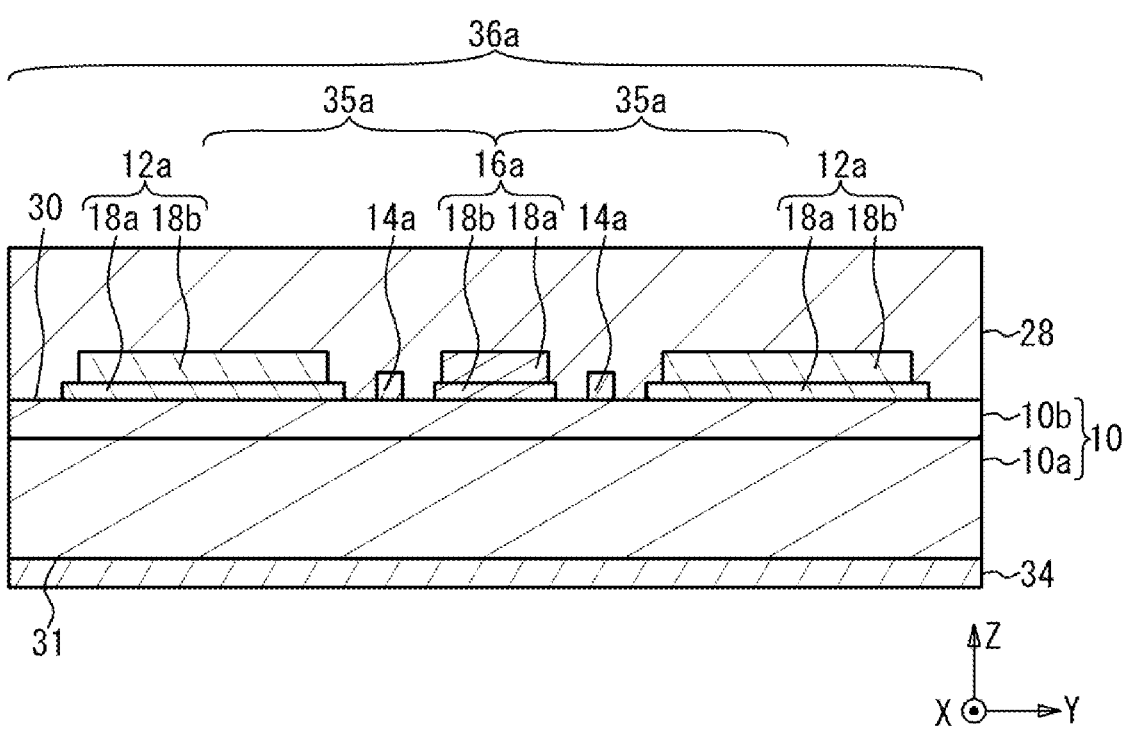
FIG. 2 is a cross-sectional view taken along line A-A of FIG. 1.
Figure 3:
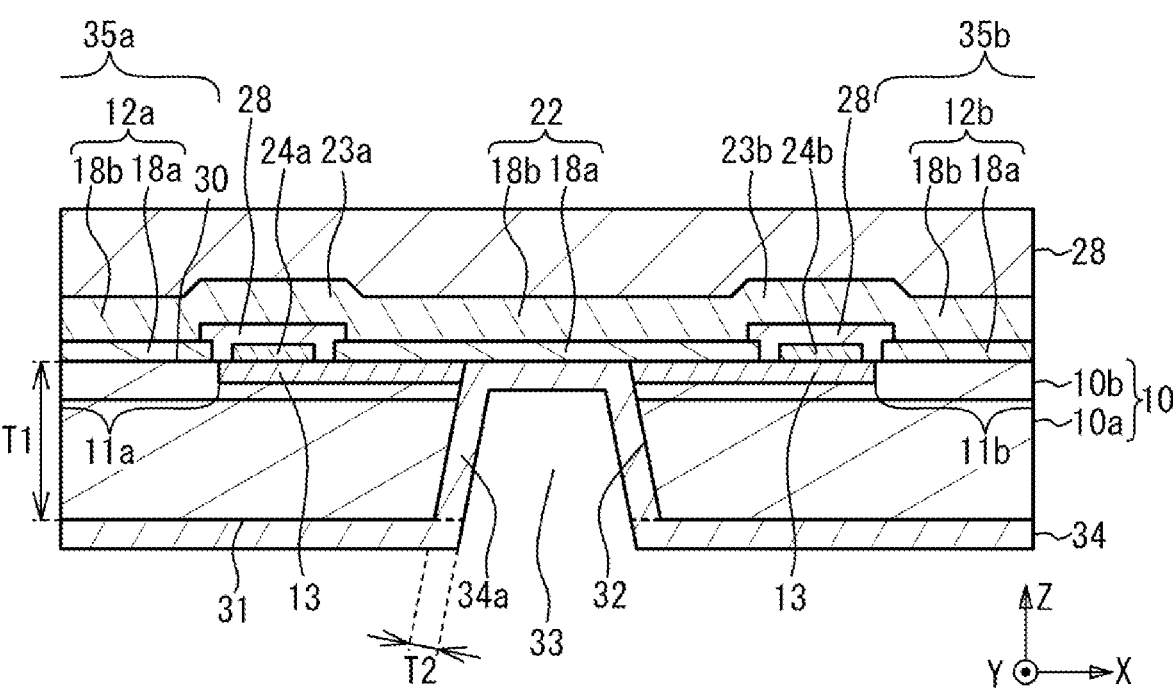
FIG. 3 is a cross-sectional view taken along line B-B of FIG. 1.

FIG. 1 is a plan view of a semiconductor device according to a first embodiment. FIG. 2 is a cross-sectional view taken along line A-A of FIG. 1. FIG. 3 is a cross-sectional view taken along line B-B of FIG. 1. A normal direction to a surface 30 of a substrate 10 is a Z direction, an extending direction of each finger is an X direction, and an extending direction of each bus bar is a Y direction. In the plan view of FIG. 1 and the like, gate fingers 14a and 14b, gate bus bars 24a and 24b, and gate pads 25a and 25b are cross-hatched.

As illustrated in FIGS. 1 to 3, in a semiconductor device 50 of the first embodiment, a plurality of FET groups 36a and 36b are provided on the surface 30 (a first surface) of the substrate 10. The FET groups 36a and 36b are arranged in the X direction. The FET group 36a includes a plurality of unit FETs 35a, and the FET group 36b includes a plurality of unit FETs 35b. The unit FETs 35a are arranged in the Y direction, and the unit FETs 35b are arranged in the Y direction. The number of unit FETs 35a in the FET group 36a and the number of unit FETs 35b in the FET group 36b may be plural.

The substrate 10 includes a substrate 10a and a semiconductor layer 10b provided on the substrate 10a. Active regions 11a and 11b are provided on the substrate 10. A region other than the active regions 11a and 11b is an inactive region 13 in which the semiconductor layer 10b is inactivated by ion implantation or the like. That is, the active regions 11a and 11b are regions in which the semiconductor layer 10b in the substrate 10 is activated, and the inactive region 13 is a region in which the semiconductor layer 10b is inactivated. The FET groups 36a and 36b are provided in the active regions 11a and 11b, respectively.

In the FET group 36a, source fingers 12a (a first source finger), gate fingers 14a (a first gate finger) and drain fingers 16a (a first drain finger) extend in the X direction (a first direction) on the active region 11a on the surface 30 of the substrate 10. Each of the source finger 12a, the gate finger 14a and the drain finger 16a has substantially a rectangular planar shape and extends in the X direction. That is, a longer side of each finger extends in the X direction, and a shorter side extends in the Y direction. The source finger 12a, the gate finger 14a and the drain finger 16a are arranged in the Y direction.

The source fingers 12a and the drain fingers 16a are alternately provided in the Y direction. The gate finger 14a is sandwiched between one source finger 12a and one drain finger 16a. The gate finger 14a, and the source finger 12a and the drain finger 16a sandwiching the gate finger 14a form a single unit FET 35a. Adjacent unit FETs 35a share the source finger 12a or the drain finger 16a. The plurality of unit FETs 35a are arranged in the Y direction (a second direction).

Also in the FET group 36b, source fingers 12b (a second source finger), gate fingers 14b (a second gate finger) and drain fingers 16b (second drain finger) are similarly provided on the active region 11b on the surface 30 of the substrate 10. The gate finger 14b, and the source finger 12b and drain finger 16b sandwiching the gate finger 14b form a single unit FET 35b. The plurality of unit FETs 35b are arranged in the Y direction (the second direction). A direction in which each of the fingers extends and a direction in which the unit FETs 35a (and 35b) are arranged need not be orthogonal to each other but may intersect each other.

A source bus bar 22, gate bus bars 24a and 24b, and drain bus bars 26a and 26b extend in the Y direction and are provided on the inactive region 13 on the surface 30 of the substrate 10. The source bus bar 22 is provided between the FET groups 36a and 36b. The gate bus bar 24a is provided between the source bus bar 22 and the FET group 36a, and the gate bus bar 24b is provided between the source bus bar 22 and the FET group 36b. The drain bus bar 26a is provided so as to sandwich the FET group 36a together with the gate bus bar 24a, and the drain bus bar 26b is provided so as to sandwich the FET group 36b together with the gate bus bar 24b.

In the FET group 36a, positive ends in the X direction of the plurality of source fingers 12a are connected to the source bus bar 22 via source wirings 23a. Positive ends in the X direction of the plurality of gate fingers 14a are connected to the gate bus bar 24a. Negative ends in the X direction of the plurality of drain fingers 16a are connected to the drain bus bar 26a. In the FET group 36b, negative ends in the X direction of the plurality of source fingers 12b are connected to the source bus bar 22 via source wirings 23b. Negative ends in the X direction of the plurality of gate fingers 14b are connected to the gate bus bar 24b. Positive ends in the X direction of the plurality of drain fingers 16b are connected to the drain bus bar 26b. Negative ends in the Y direction of the gate bus bars 24a and 24b are connected to the gate pads 25a and 25b, respectively.

Via holes 32 extending through the substrate 10 are provided under the source bus bar 22. The planar shape of each via hole 32 is, for example, substantially an ellipse. A major axis direction of the via hole 32 is the Y direction, and a width Wy of the via hole 32 in the Y direction is larger than a width Wx in the X direction. The plurality of via holes 32 are provided in the extending direction of the source bus bar 22.

A FET set 38 includes the FET groups 36a and 36b, the source bus bars 22, the gate bus bars 24a and 24b, and the drain bus bars 26a and 26b.

As illustrated in FIG. 2, in the FET group 36a, the source finger 12a, the gate finger 14a and the drain finger 16a are provided on the semiconductor layer 10b. Each of the source finger 12a and the drain finger 16a includes an ohmic metal layer 18a and a low-resistance layer 18b provided on the semiconductor layer 10b. The ohmic metal layer 18a makes an ohmic contact with the semiconductor layer 10b. The material of the low resistance layer 18b has a lower resistivity than the material of the ohmic metal layer 18a. The low-resistance layer 18b is thicker than the ohmic metal layer 18a. Thus, the sheet resistance of the low-resistance layer 18b is lower than that of the ohmic metal layer 18a. Also in the FET group 36b, each of the source finger 12b and the drain finger 16b includes the ohmic metal layer 18a and the low-resistance layer 18b. The ohmic metal layers 18a in the source fingers 12a and 12b, the drain fingers 16a and 16b and the source bus bar 22 are made of the same material and formed simultaneously. The low-resistance layers 18b in the source fingers 12a and 12b, the drain fingers 16a and 16b, the source wirings 23a and 23b and the source bus bar 22 are formed simultaneously. An insulating layer 28 is provided on the semiconductor layer 10b so as to cover the source finger 12a, the gate finger 14a and the drain finger 16a. A metal layer 34 is provided on a back surface 31 (a second surface opposite to the first surface) of the substrate 10. A reference potential such as a ground potential is supplied to the metal layer 34.

As illustrated in FIG. 3, the source bus bar 22 includes the ohmic metal layer 18a and the low-resistance layer 18b. The source wiring 23a connecting the source bus bar 22 to the source finger 12a and the source wiring 23b connecting the source bus bar 22 to the source finger 12b are provided with the low-resistance layer 18b and are not provided with the ohmic metal layer 18a. The gate bus bars 24a and 24b are made of the same metal layer as the gate fingers 14a and 14b, and are provided on the semiconductor layer 10b. The source wirings 23a and 23b intersect on the gate bus bars 24a and 24b without contacting the gate bus bars 24a and 24b, respectively. The insulating layer 28 is provided between the source wiring 23a and the gate bus bar 24a and between the source wiring 23b and the gate bus bar 24b.

The via hole 32 penetrates the substrate 10 and is connected to the source bus bar 22. A region where the via hole 32 is connected to the source bus bar 22 as viewed from the thickness direction (Z direction) of the substrate 10 is included within the source bus bar 22. That is, the via hole 32 is not provided outside the source bus bar 22 in the surface 30. The metal layer 34 is provided on the back surface 31 of the substrate 10. A metal layer 34a is provided on the side and upper surfaces of the via hole 32. The metal layer 34a electrically connects and short-circuits the metal layer 34 and the source bus bar 22. The metal layer 34a is the same metal layer as the metal layer 34 and is formed at the same time. A cavity 33 is provided in the metal layer 34a in the via hole 32. The cavity 33 is filled with a gas such as air.

When the semiconductor device is, for example, a nitride semiconductor device, the substrate 10a is, for example, an SiC substrate, a silicon substrate, a GaN substrate, or a sapphire substrate. The semiconductor layer 10b includes, for example, a nitride semiconductor layer such as a GaN layer, an AlGaN layer and/or an InGaN layer. When the semiconductor device is, for example, a GaAs-based semiconductor device, the substrate 10a is, for example, a GaAs substrate. The semiconductor layer 10b includes, for example, an arsenide semiconductor layer such as a GaAs layer, an AlGaAs layer and/or an InGaAs layer. The ohmic metal layer 18a includes, for example, an adhesion film (for example, a titanium film) and an aluminum film stacked in this order from the substrate 10. The low-resistance layer 18b is, for example, a gold layer. The gate fingers 14a and 14b and the gate bus bars 24a and 24b are metal films, for example, and include an adhesion film (for example, a nickel film) and a gold film stacked in this order from the substrate 10. The metal layers 34 and 34a include, for example, an adhesion layer and a gold layer stacked in this order from the substrate 10.

The lengths of the gate fingers 14a and 14b in the Y direction are gate lengths, and are, for example, 0.05 μm to 5 μm. The widths of the active regions 11a and 11b in the X direction are gate widths of the unit FETs 35a and 35b, and are, for example, 50 μm to 1000 μm. The widths of the source fingers 12a and 12b in the Y direction are, for example, 50 μm to 200 μm, and the widths of the drain fingers 16a and 16b in the Y direction are, for example, 5 μm to 500 μm. The width of the source bus bar 22 in the X direction is, for example, 10 μm to 100 μm. The widths of the gate bus bars 24a and 24b in the X direction are, for example, 10 μm to 50 μm. The thickness of the substrate 10 is, for example, 10 μm to 500 μm.

First Comparative Example

Figure 4:
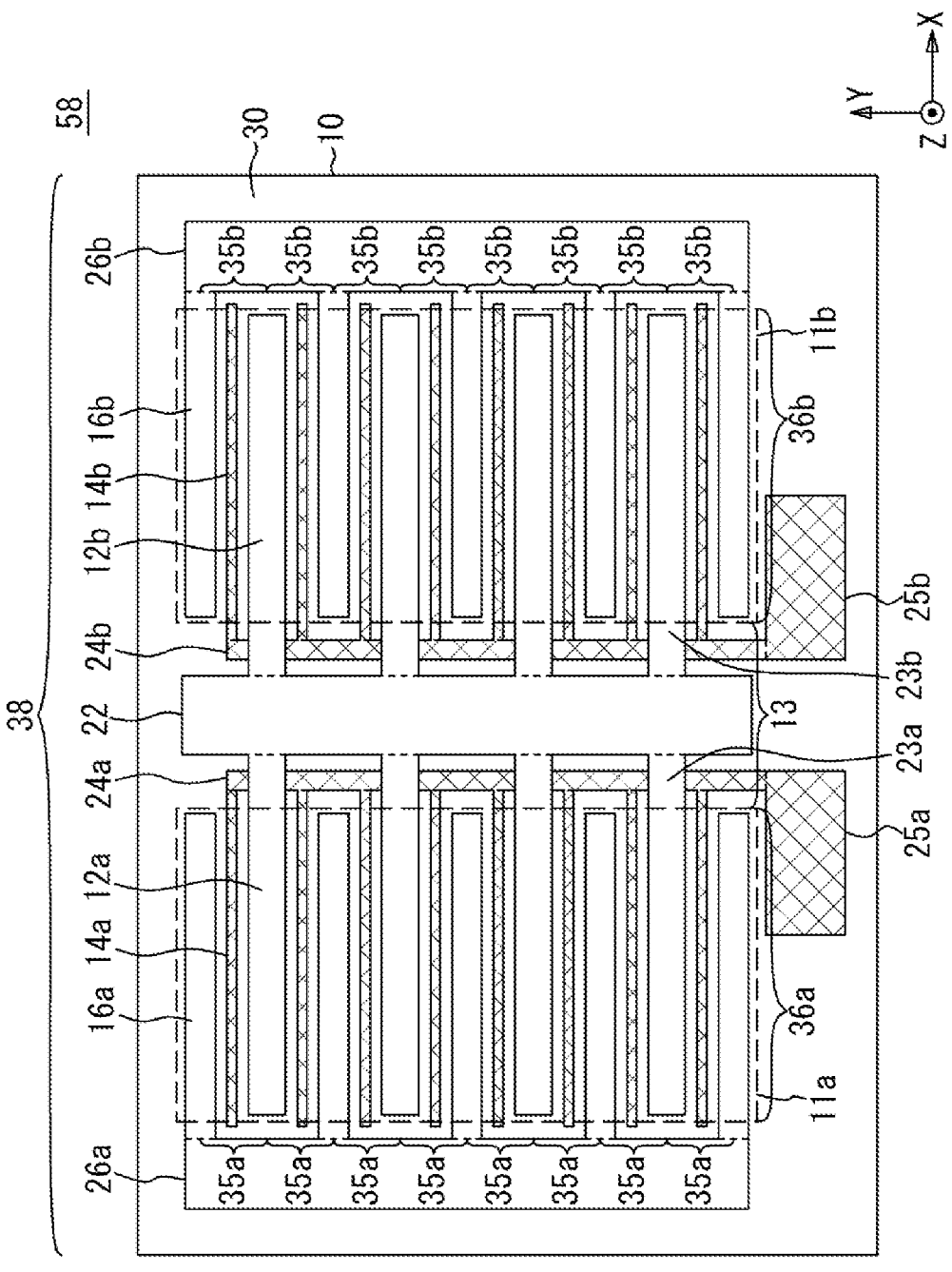
FIG. 4 is a plan view of a semiconductor device according to a first comparative example.

FIG. 4 is a plan view of the semiconductor device according to a first comparative example. As illustrated in FIG. 4, in a semiconductor device 58 of the first comparative example, the source bus bar 22 is not provided with the via hole 32. Other configurations are the same as those of the first embodiment, and description thereof is omitted.

In the first comparative example, heat generated in the FET group 36a is propagated to the FET group 36b, and heat generated in the FET group 36b is propagated to the group FET 36a. Each of the FET groups 36a and 36b is designed in consideration of heat generated independently. Therefore, when the heat generated in the FET group 36a and the heat generated in the FET group 36b interfere with each other, the operation of each of the FET groups 36a and 36b may be different from the design.

According to the first embodiment, as illustrated in FIG. 1, in the semiconductor device 50, a plurality of unit FETs 35a (a first transistor) and a plurality of unit FETs 35b (a second transistor) sandwich the source bus bar 22, and the source fingers 12a and 12b are electrically connected to and short-circuited to the source bus bar 22. In such a structure, the source bus bar 22 overlaps the via holes 32 (a first via hole) penetrating through the substrate 10 as viewed in the thickness direction of the substrate 10. The via holes 32 allow for heat separation between FET groups 36a and 36b. Therefore, the interference between the heat generated in the FET group 36a and the heat generated in the FET group 36b can be suppressed. Therefore, it is possible to prevent the operation of each of the FET groups 36a and 36b from being different from the designed operation.

As illustrated in FIG. 3, at least a part of the via hole 32 is the cavity 33. Thus, if the cavity 33 is present in the via hole 32, the via hole 32 allows more heat separation between the FET groups 36a and 36b.

The metal layer 34 (a second metal layer) is provided on the back surface 31 of the substrate 10 opposite the surface 30 and is electrically connected to and short-circuited to the source bus bar 22 via the via hole 32. Thus, an inductance between the source bus bar 22 and the metal layer 34 can be reduced. When the reference potential is supplied to the metal layer 34, a source inductance can be reduced.

The metal layer 34a is provided on the side surface of the via hole 32 and electrically connects the source bus bar 22 and the metal layer 34. The cavity 33 is formed inside the metal layer 34a in the via hole 32. Thus, a part of the via hole 32 is formed as the cavity 33, and the source bus bar 22 and the metal layer 34 can be electrically connected and short-circuited. In order to provide the cavity 33 in the via hole 32, the thickness T2 of the metal layer 34a in the via hole 32 is preferably ½ or less and more preferably 1/10 or less of a thickness T1 of the substrate 10.

Although one via hole 32 may be provided in one source bus bar 22, it is preferable that the plurality of via holes 32 are arranged in the Y direction as illustrated in FIG. 1. The plurality of via holes 32 allow more heat separation between the FET groups 36a and 36b.

The width Wy of the via hole 32 in the Y direction is larger than the width Wx in the X direction. This allows more heat separation between the FET groups 36a and 36b. The width Wy is preferably 1.5 times or more and more preferably 2 times or more of the width Wx. The planar shape of the via hole 32 may be an oval shape, an edge-rounded rectangular shape or a track shape other than an ellipse shape.

When viewed from the X direction, the sum of the lengths of the via holes 32 on the surface 30 in the Y direction with respect to the length of the source bus bar 22 on the surface 30 in the Y direction is preferably ⅕ times or more and more preferably ½ times or more. This allows more heat separation between the FET groups 36a and 36b.

Figure 5:
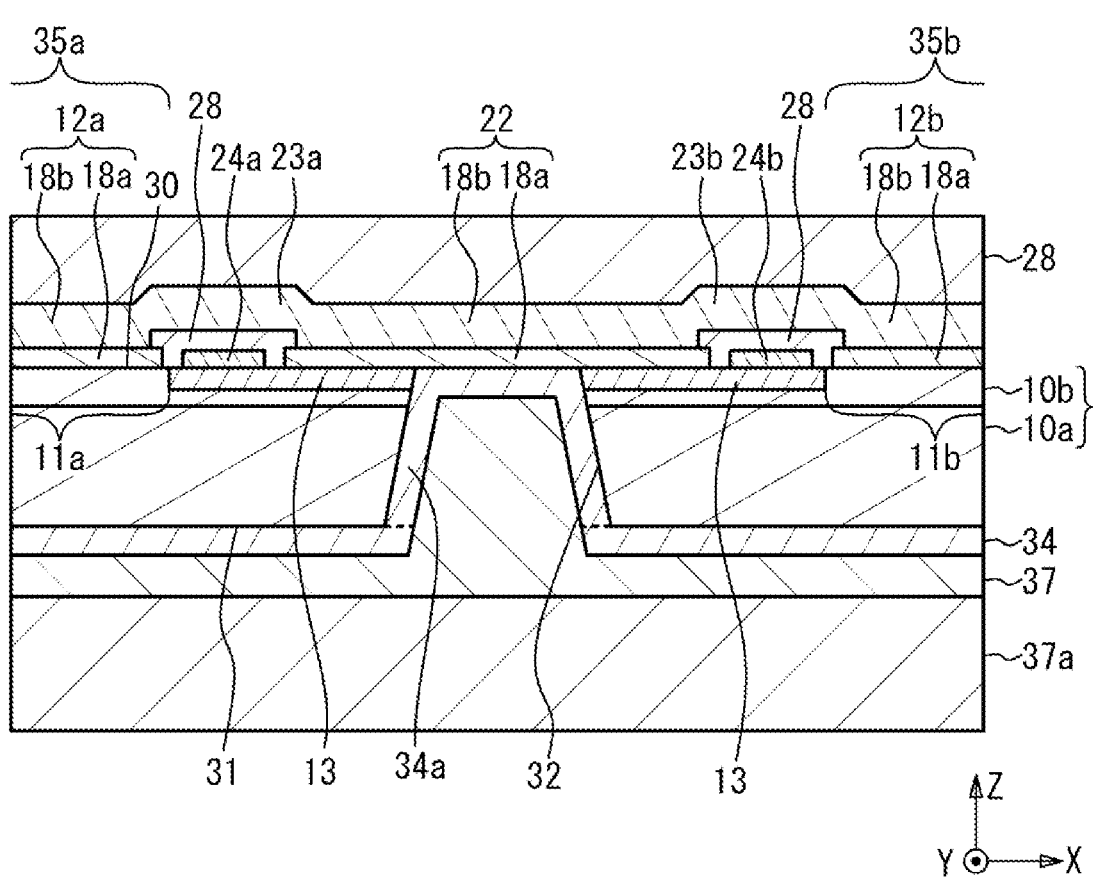
FIG. 5 is a cross-sectional view illustrating an example in which a semiconductor chip is mounted on a mounting substrate in the first embodiment.

FIG. 5 is a cross-sectional view illustrating an example in which a semiconductor chip is mounted on a mounting substrate in the first embodiment. As illustrated in FIG. 5, the semiconductor device 50 of the first embodiment is mounted on a mounting substrate 37a using a solder 37. The via hole 32 is filled with the solder 37. The thermal conductivities of the SiC substrate and the silicon substrate used as the substrate 10a are 200 W/(m·K) to 450 W/(m·K) and 162 W/(m·K), respectively. On the other hand, the thermal conductivity of the solder 37 is low. For example, the thermal conductivity of tin-silver-copper solder is 55 W/(m·K). Therefore, even when the cavity 33 in the via hole 32 is filled with the solder 37, the via hole 32 enables heat separation between the FET groups 36a and 36b.

Figure 6:
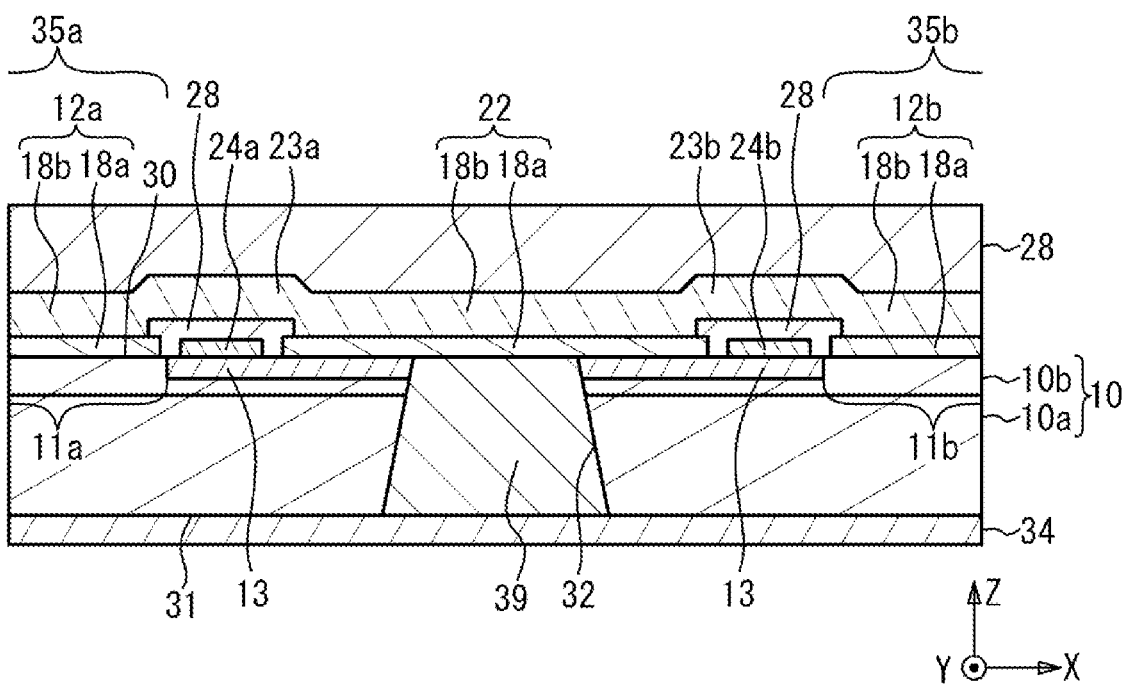
FIG. 6 is a cross-sectional view illustrating another example of a via hole according to the first embodiment.

FIG. 6 is a cross-sectional view illustrating another example of the via hole according to the first embodiment. As illustrated in FIG. 6, a metal layer 39 (a first metal layer) is filled in the via hole 32 so as not to form a void. Even in the structure of such a bias hole 32, if the thermal conductivity of the substrate 10a is higher than the thermal conductivity of the metal layer 39, the via hole 32 enables heat separation between the FET groups 36a and 36b. For example, the thermal conductivities of copper and gold is 386 W/(m·K) and 295 W/(m·K), respectively, which are lower than the thermal conductivity of SiC. The thermal conductivity of the metal layer 39 is preferably 0.9 times or less and more preferably 0.8 times or less of the thermal conductivity of the substrate 10a.

By providing the metal layer 34 on the back surface 31 of the substrate 10 and on the lower surface of the metal layer 39, the metal layer 34 and the source bus bar 22 can be electrically connected and short-circuited. Thus, the source inductance can be suppressed.

The gate bus bar 24a may be provided between the drain bus bar 26a and the FET group 36a, and the gate bus bar 24b may be provided between the drain bus bar 26b and the FET group 36b. In this case, a direction in which the high-frequency signal is input from the gate bus bar 24a to the gate finger 14a and a direction in which the high-frequency signal is output from the drain finger 16a to the drain bus bar 26a are opposite to each other. Therefore, the phases of the input signal and the output signal are not aligned in the X direction, and the high-frequency characteristics of the FET group 36a deteriorate. The same applies to the FET group 36b.

The gate bus bars 24a and 24b are commonly provided, and may be provided above the source bus bar 22 in a non-contact manner. In this case, a source-gate capacitance is increased.

Therefore, as illustrated in FIG. 1, it is preferable that the gate bus bar 24a (a first gate bus bar) is provided on the surface 30 between the plurality of unit FETs 35a and the source bus bar 22, and the gate bus bar 24b (a second gate bus bar) is provided on the surface 30 between the plurality of unit FETs 35b and the source bus bar 22. As a result, the source-gate capacitance can be suppressed compared with a case where the gate bus bar is provided above the source bus bar 22.

In the first comparative example of FIG. 4, the gate bus bars 24a and 24b are electromagnetically coupled to each other, so that oscillation or the like easily occurs. In the first embodiment, the source bus bar 22 is short-circuited through the via hole 32 to the metal layer 34 to which the ground potential is supplied. Thus, a shielding effect of the source bus bar 22 is increased. Therefore, the electromagnetic coupling between the gate bus bars 24a and 24b can be suppressed, and the oscillation or the like can be suppressed.

As illustrated in FIG. 3, the source wiring 23a (a first source wiring) connects the source finger 12a and the source bus bar 22 and intersects the gate bus bar 24a in the non-contact manner. The source wiring 23b (a second source wiring) connects the source finger 12b and the source bus bar 22, and intersects the gate bus bar 24b in the non-contact manner. Thus, even if the gate bus bar 24a is provided between the source bus bar 22 and the FET group 36a and the gate bus bar 24b is provided between the source bus bar 22 and the FET group 36b, the electrical contact between the source bus bar 22 and the gate bus bars 24a and 24b can be suppressed.

The drain bus bar 26a (a first drain bus bar) and the source bus bar 22 sandwich the plurality of unit FETs 35a, and the drain bus bar 26b (a second drain bus bar) and the source bus bar 22 sandwich the plurality of unit FETs 35b. Thus, the direction in which the high-frequency signal is input from the gate bus bar 24a to the gate finger 14a and the direction in which the high-frequency signal is output from the drain finger 16a to the drain bus bar 26a become the same direction. Therefore, the phases of the input signal and the output signal are aligned in the X direction, and degradation of the high-frequency characteristics of the FET group 36a can be suppressed. The same applies to the FET group 36b.

[First Modification of First Embodiment]

Figure 7:
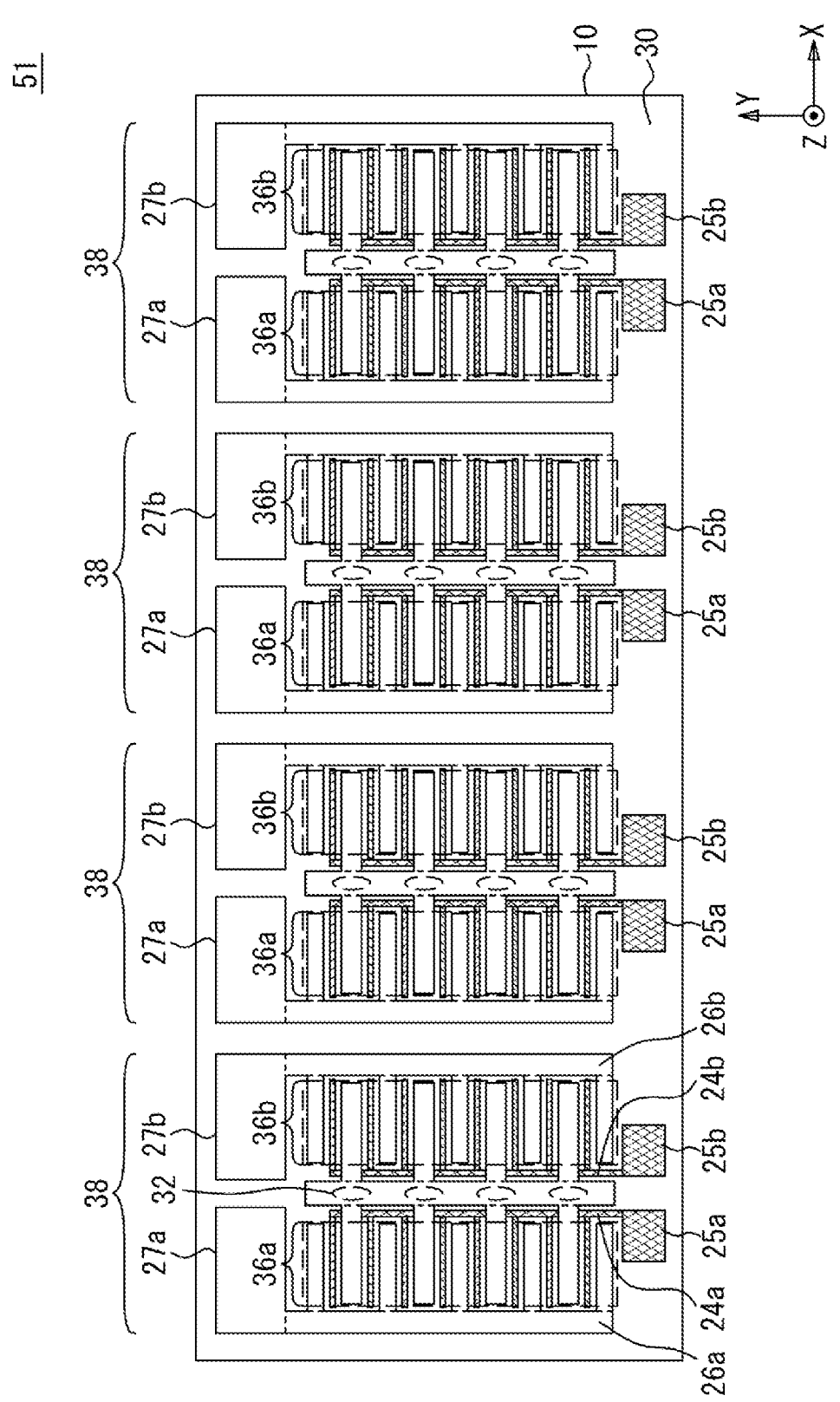
FIG. 7 is a plan view of a semiconductor device according to a first modification of the first embodiment.

FIG. 7 is a plan view of a semiconductor device according to a first modification of the first embodiment. As illustrated in FIG. 7, in a semiconductor device 51, a plurality of FET sets 38 are arranged in the X direction. The gate pads 25a and 25b are provided on negative sides in the Y direction of the FET groups 36a and 36b. The gate pads 25a and 25b are connected to gate bus bars 24a and 24b, respectively, and the gate pads 25a and 25b have the same potentials as those of gate bus bars 24a and 24b, respectively. Drain pads 27a and 27b are provided on positive sides in the Y direction of the FET groups 36a and 36b. The drain pads 27a and 27b are connected to the drain bus bars 26a and 26b, respectively, and the drain pads 27a and 27b have the same potentials as those of the drain bus bars 26a and 26b, respectively. The gate pad 25a and the drain pad 27a are pads for electrically connecting the unit FETs 35a to the outside, and the gate pad 25b and the drain pad 27b are pads for electrically connecting the unit FETs 35b to the outside.

As illustrated in FIG. 7, a plurality of FET sets 38 may be arranged in the X direction. In this case, for example, a leftmost FET group 36a and a rightmost FET group 36b have FET groups on only one side, so that the temperature hardly rises during operation. Therefore, the leftmost FET group 36a and the rightmost FET group 36b may be designed differently than the other FET groups 36a and 36b. In such a design, if thermal interference between the leftmost FET group 36a and the adjacent FET group 36b is large, the leftmost FET group 36*a* may be affected by the heat of the adjacent FET group 36*b* and may not operate as designed. Thus, the via holes 32 are formed in the source bus bar 22 located between the leftmost FET group 36*a* and the adjacent FET group 36*b*. As a result, the leftmost FET group 36*a* and the adjacent FET group 36*b* can be thermally separated. The same applies to the rightmost FET group 36*b* and the adjacent FET group 36*a*.

In FIG. 7, the single gate bus bar 24*a* is electrically connected to the single gate pad 25*a*, and the single gate bus bar 24*b* is electrically connected to the single gate pad 25*b*. The single drain bus bar 26*a* is electrically connected to the single drain pad 27*a*, and the single drain bus bar 26*b* is electrically connected to the single drain pad 27*b*. The gate pads 25*a* and 25*b* in the same FET set 38 may form a single gate pad. The drain pads 27*a* and 27*b* in the same FET set 38 may form a single drain pad. The plurality of gate bus bars 24*a* and 24*b* may be electrically connected to the single gate pad, and the plurality of drain bus bars 26*a* and 26*b* may be electrically connected to the single drain pad. The plurality of gate bus bars 24*a* and 24*b* on the substrate 10 may all be electrically connected to the single gate pad, and the plurality of drain bus bars 26*a* and 26*b* on the substrate 10 may all be electrically connected to the single drain pad.

Second Embodiment

Figure 8:
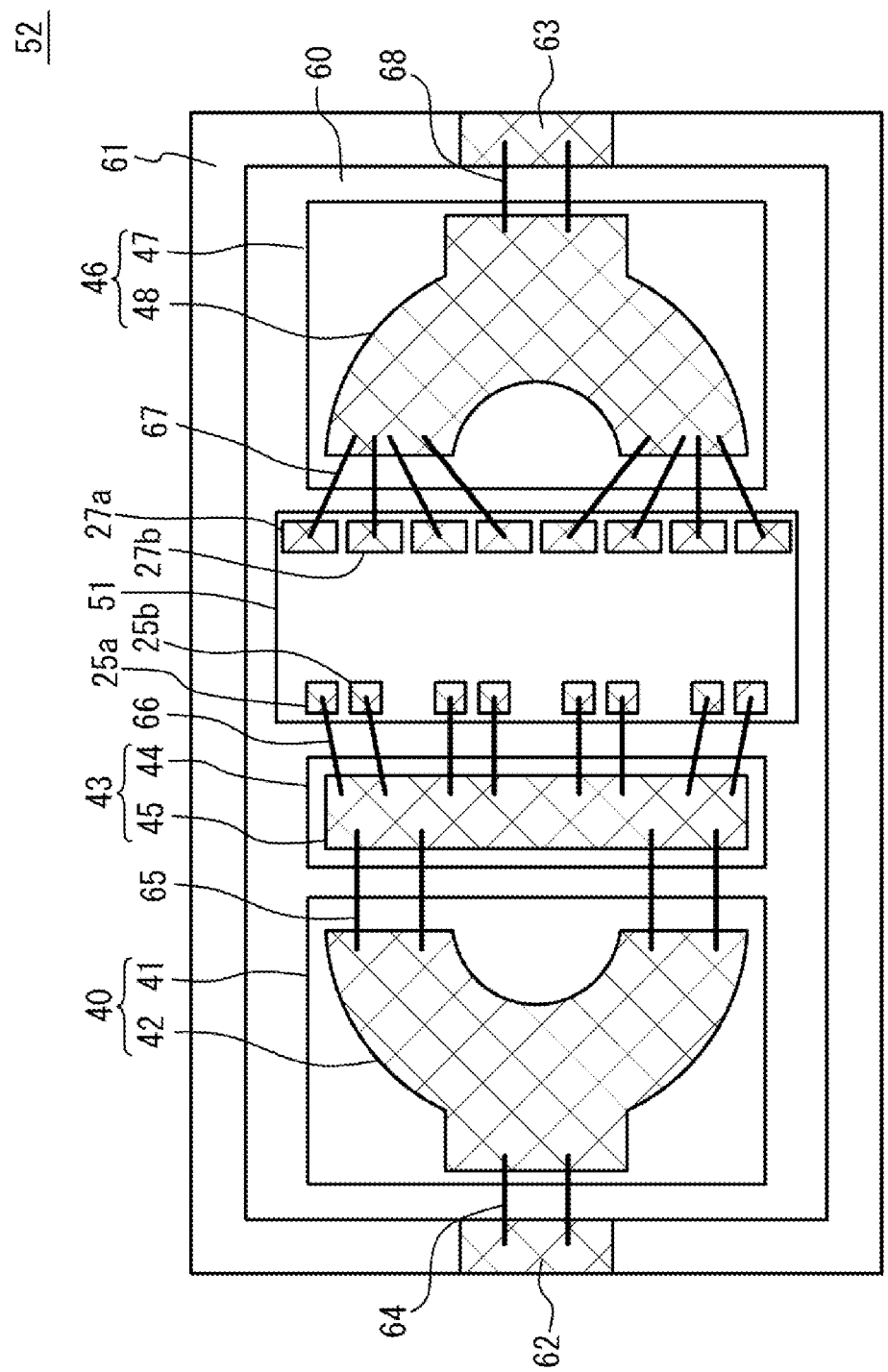
FIG. 8 is a plan view of a semiconductor device according to a second embodiment.

A second embodiment is an example of a semiconductor device in which the semiconductor device 51 which is the semiconductor chip of the first modification of the first embodiment is mounted on a package. FIG. 8 is a plan view of the semiconductor device according to the second embodiment. In FIG. 8, the gate pads 25*a* and 25*b*, the drain pads 27*a* and 27*b*, conductor patterns 42 and 45, 48, an input terminal 62 and an output terminal 63 are cross-hatched.

As illustrated in FIG. 8, in a semiconductor device 52, an insulating frame 61 made of ceramics or the like is mounted on a base 60 made of a metal such as copper. The input terminal 62 and the output terminal 63 are provided on the frame 61. Chips 40, 43 and 46 and the semiconductor device 52 are mounted on the base 60. The chip 40 includes a dielectric layer 41, the conductor pattern 42 provided on the dielectric layer 41, and a conductor pattern (not illustrated) provided under the dielectric layer 41. The chip 43 includes a dielectric layer 44 and the conductor pattern 45 provided on the dielectric layer 44. The chip 46 includes a dielectric layer 47 and the conductor pattern 48 provided on the dielectric layer 47. The conductor patterns 42, 45 and 48, the input terminal 62 and the output terminal 63 are metal layers such as gold layers. The gate pads 25*a* and 25*b* and the drain pads 27*a* and 27*b* are provided on the semiconductor device 52. In FIG. 8, elements other than the gate pads 25*a* and 25*b* and the drain pads 27*a* and 27*b* of the semiconductor device 51 are not illustrated.

Bonding wires 64 electrically connect the input terminal 62 and the conductor pattern 42. Bonding wires 65 electrically connects the conductor patterns 42 and 45. Bonding wires 66 electrically connect the conductive pattern 45 and the gate pads 25*a* and 25*b*. Bonding wires 67 electrically connect the drain pads 27*a* and 27*b* and the conductor pattern 48. Bonding wires 68 electrically connect the conductor pattern 48 and the output terminal 63.

The conductor pattern 42 is a pattern for aligning the electrical lengths of the bonding wires 64 and 65. The conductor pattern 45 and the conductor pattern under the dielectric layer 44 which sandwich the dielectric layer 44 function as a shunt-connected capacitor. The bonding wires

65 and 66 and the chip 43 form an input matching circuit. The conductor pattern 48 is a pattern for aligning the electrical lengths of the bonding wires 67 and 68. The high-frequency signal inputted from the input terminal 62 is inputted to the semiconductor device 52 through the chips 40 and 43. The high-frequency signal amplified in the semiconductor device 52 is output from the output terminal 63 via the chip 46. As in FIG. 7, the gate pads 25*a* and 25*b* and the drain pads 27*a* and 27*b* are provided on the long sides of the substrate 10. Therefore, the bonding wires 66 can be easily bonded to the gate pads 25*a* and 25*b*, and the bonding wires 67 can be easily bonded to the drain pads 27*a* and 27*b*. As in the second embodiment, the semiconductor device of the first embodiment and its modification may have a configuration in which the semiconductor chips are mounted on the package.

Third Embodiment

Figure 9:
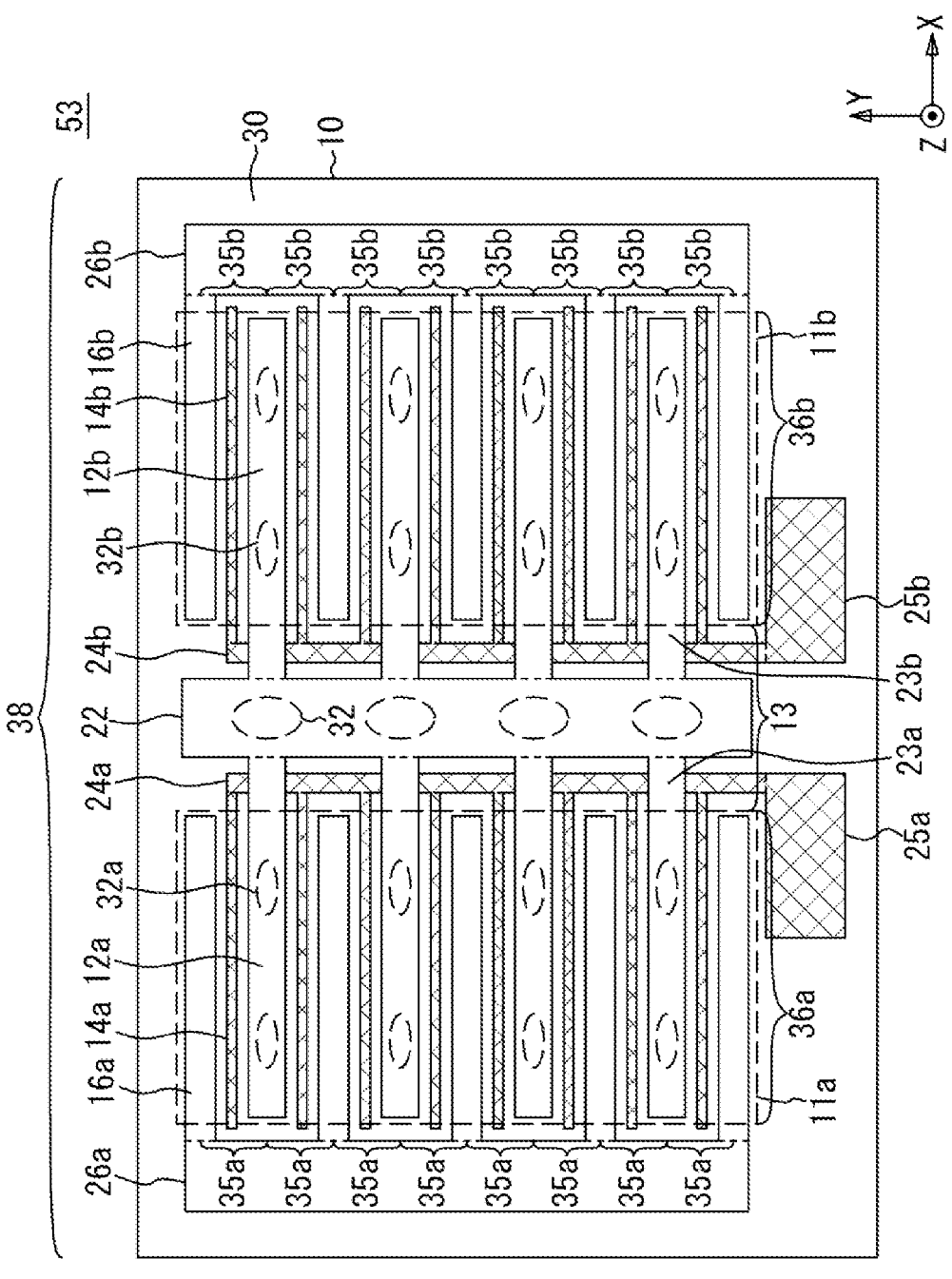
FIG. 9 is a plan view of a semiconductor device according to a third embodiment.

FIG. 9 is a plan view of a semiconductor device according to a third embodiment. As illustrated in FIG. 9, in a semiconductor device 53, the source finger 12*a* is provided with via holes 32*a*, and the source finger 12*b* is provided with via holes 32*b*. The via holes 32*a* and 32*b* have the same cross-sectional shape as the via hole 32 in FIG. 3, FIG. 5 or FIG. 6, and description thereof will be omitted. Other configurations are the same as those of the first embodiment, and description thereof is omitted.

According to the third embodiment, the source finger 12*a* overlaps the via hole 32*a* (a second via hole) penetrating through the substrate 10 as viewed in the thickness direction of the substrate 10. The source finger 12*b* overlaps with the via hole 32*b* (a third via hole) penetrating through the substrate 10 as viewed in the thickness direction of the substrate 10. Thus, the unit FETs 35*a* in the FET group 36*a* can be thermally separated from each other, and the unit FETs 35*b* in the FET group 36*b* can be thermally separated from each other.

The source finger 12*a* is electrically connected to and short-circuited with the metal layer 34 through the via holes 32*a*. The source finger 12*b* is electrically connected and short-circuited with the metal layer 34 through the via holes 32*b*. Thus, the source inductance of the unit FETs 35*a* and 35*b* can be reduced.

[First Modification of Third Embodiment]

Figure 10:
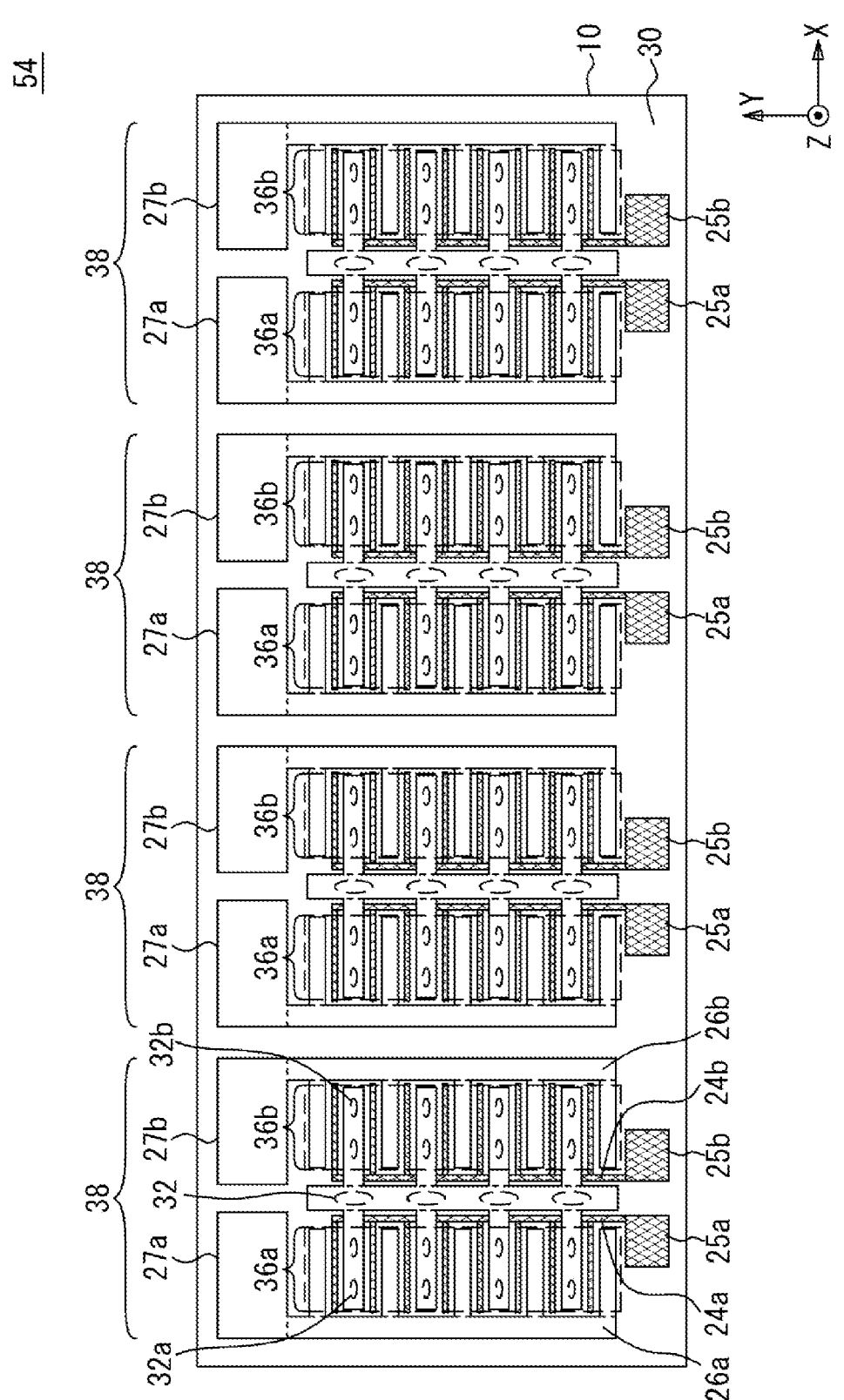
FIG. 10 is a plan view of a semiconductor device according to a first modification of the third embodiment.

FIG. 10 is a plan view of a semiconductor device according to a first modification of the third embodiment. As illustrated in FIG. 10, in a semiconductor device 54, the same plurality of FET sets 38 as in the third embodiment are arranged in the X direction. The source finger 12*a* is provided with the via holes 32*a*, and the source finger 12*b* is provided with the via holes 32*b*. Other configurations are the same as those of the third embodiment, and description thereof will be omitted. As in the first modification of the first embodiment, the plurality of FET sets 38 may be arranged in the X direction.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
a source bus bar provided on a first surface of a substrate and overlapping with a first via hole penetrating through the substrate as viewed from a thickness direction of the substrate;
a plurality of first transistors arranged in a second direction intersecting a first direction, each of the first transistors including a first source finger, a first drain finger and a first gate finger which extend in the first direction and are provided on the first surface, the first source finger being electrically connected to the source bus bar; and
a plurality of second transistors arranged in the second direction, each of the second transistors including a second source finger, a second drain finger and a second gate finger which extend in the first direction and are provided on the first surface, the second source finger being electrically connected to the source bus bar, the first transistors and the second transistors sandwiching the source bus bar,
wherein a width of the first via hole in the second direction is larger than a width of the first via hole in the first direction.

2. The semiconductor device according to claim 1, wherein
at least a part of the first via hole is a cavity.

3. The semiconductor device according to claim 1, further comprising
a first metal layer filled in the first via hole and having a thermal conductivity lower than a thermal conductivity of the substrate.

4. The semiconductor device according to claim 1, wherein
the source bus bar overlaps with a plurality of first via holes, and
the plurality of first via holes are arranged in the second direction.

5. The semiconductor device according to claim 1, further comprising:
a first gate bus bar provided on the first surface between the plurality of first transistors and the source bus bar and electrically connected to the first gate finger; and
a second gate bus bar provided on the first surface between the plurality of second transistors and the source bus bar and electrically connected to the second gate finger.

6. The semiconductor device according to claim 5, further comprising:
a first source wiring electrically connecting the first source finger and the source bus bar and intersecting the first gate bus bar in a non-contact manner; and
a second source wiring electrically connecting the second source finger and the source bus bar and intersecting the second gate bus bar in the non-contact manner.

7. The semiconductor device according to claim 5, further comprising:
a first drain bus bar provided on the first surface, sandwiching the plurality of first transistors together with the source bus bar, and connected to the first drain finger; and
a second drain bus bar provided on the first surface, sandwiching the plurality of second transistors together with the source bus bar, and connected to the second drain finger.

8. The semiconductor device according to claim 1, wherein
the first source finger overlaps with a second via hole penetrating through the substrate as viewed from the thickness direction of the substrate, and
the second source finger overlaps with a third via hole penetrating through the substrate as viewed from the thickness direction of the substrate.

9. The semiconductor device according to claim 1, further comprising
a second metal layer provided on a second surface opposite to the first surface of the substrate and electrically connected to the source bus bar via the first via hole.

10. A semiconductor device comprising:
a source bus bar provided on a first surface of a substrate and overlapping with a first via hole penetrating through the substrate as viewed from a thickness direction of the substrate;
a plurality of first transistors arranged in a second direction intersecting a first direction, each of the first transistors including a first source finger, a first drain finger and a first gate finger which extend in the first direction and are provided on the first surface, the first source finger being electrically connected to the source bus bar;
a plurality of second transistors arranged in the second direction, each of the second transistors including a second source finger, a second drain finger and a second gate finger which extend in the first direction and are provided on the first surface, the second source finger being electrically connected to the source bus bar, the first transistors and the second transistors sandwiching the source bus bar; and
a first metal layer filled in the first via hole and having a thermal conductivity lower than a thermal conductivity of the substrate.

11. The semiconductor device according to claim 10, wherein
at least a part of the first via hole is a cavity.

12. The semiconductor device according to claim 10, wherein
the source bus bar overlaps with a plurality of first via holes, and
the plurality of first via holes are arranged in the second direction.

13. The semiconductor device according to claim 10, wherein
a width of the first via hole in the second direction is larger than a width of the first via hole in the first direction.

14. The semiconductor device according to claim 10, further comprising:
a first gate bus bar provided on the first surface between the plurality of first transistors and the source bus bar and electrically connected to the first gate finger; and
a second gate bus bar provided on the first surface between the plurality of second transistors and the source bus bar and electrically connected to the second gate finger.

15. The semiconductor device according to claim 14, further comprising:
a first source wiring electrically connecting the first source finger and the source bus bar and intersecting the first gate bus bar in a non-contact manner; and
a second source wiring electrically connecting the second source finger and the source bus bar and intersecting the second gate bus bar in the non-contact manner.

16. The semiconductor device according to claim 14, further comprising:

a first drain bus bar provided on the first surface, sandwiching the plurality of first transistors together with the source bus bar, and connected to the first drain finger; and a second drain bus bar provided on the first surface, sandwiching the plurality of second transistors together with the source bus bar, and connected to the second drain finger.

17. The semiconductor device according to claim 10, wherein the first source finger overlaps with a second via hole penetrating through the substrate as viewed from the thickness direction of the substrate, and the second source finger overlaps with a third via hole penetrating through the substrate as viewed from the thickness direction of the substrate.

18. The semiconductor device according to claim 10, further comprising a second metal layer provided on a second surface opposite to the first surface of the substrate and electrically connected to the source bus bar via the first via hole.

19. A semiconductor device comprising:

a source bus bar provided on a first surface of a substrate and overlapping with a first via hole penetrating through the substrate as viewed from a thickness direction of the substrate;

a plurality of first transistors arranged in a second direction intersecting a first direction, each of the first transistors including a first source finger, a first drain finger and a first gate finger which extend in the first direction and are provided on the first surface, the first source finger being electrically connected to the source bus bar;

a plurality of second transistors arranged in the second direction, each of the second transistors including a second source finger, a second drain finger and a second gate finger which extend in the first direction and are provided on the first surface, the second source finger being electrically connected to the source bus bar, the first transistors and the second transistors sandwiching the source bus bar;

a first gate bus bar provided on the first surface between the plurality of first transistors and the source bus bar and electrically connected to the first gate finger; and a second gate bus bar provided on the first surface between the plurality of second transistors and the source bus bar and electrically connected to the second gate finger; and a first source wiring electrically connecting the first source finger and the source bus bar and intersecting the first gate bus bar in a non-contact manner; and a second source wiring electrically connecting the second source finger and the source bus bar and intersecting the second gate bus bar in the non-contact manner.

* * * * *